United States Patent
Miyake et al.

(10) Patent No.: US 8,569,647 B2
(45) Date of Patent: Oct. 29, 2013

(54) HEAT TREATMENT APPARATUS

(75) Inventors: Masatoshi Miyake, Kamakura (JP);
Ken'etsu Yokogawa, Tsurugashima (JP)

(73) Assignee: Hitachi High-Technologies Corporation, Tokyo (JP)

( * ) Notice: Subject to any disclaimer, the term of this patent is extended or adjusted under 35 U.S.C. 154(b) by 134 days.

(21) Appl. No.: 13/185,622

(22) Filed: Jul. 19, 2011

(65) Prior Publication Data
US 2012/0285935 A1   Nov. 15, 2012

(30) Foreign Application Priority Data
May 10, 2011   (JP) ................ 2011-104841

(51) Int. Cl.
 *B23K 10/00* (2006.01)
 *H05B 1/02* (2006.01)
 *F27D 11/12* (2006.01)

(52) U.S. Cl.
 USPC ........... 219/121.54; 219/121.44; 219/121.58; 392/416; 156/345.52; 216/67; 438/660

(58) Field of Classification Search
 CPC .......... H05B 1/02; F27D 11/12; B23K 10/00
 USPC .............. 219/121.4, 121.43, 121.48, 121.59, 219/121.44; 392/416–418; 156/345.52, 156/345.51, 345.43, 345.47, 345.48; 216/67, 71; 438/660, 663, 664, 787, 438/792, 799, 798, 951; 437/171, 196, 199, 437/247
 See application file for complete search history.

(56) References Cited

U.S. PATENT DOCUMENTS

| | | | | |
|---|---|---|---|---|
| 3,935,809 | A  * | 2/1976 | Bauer | 99/447 |
| 4,922,079 | A  * | 5/1990 | Bowen et al. | 219/415 |
| 5,221,201 | A  * | 6/1993 | Yamaga et al. | 432/241 |
| 6,072,160 | A  * | 6/2000 | Bahl | 219/405 |
| 6,632,325 | B2 * | 10/2003 | Lingampalli | 156/345.51 |
| 6,815,365 | B2 * | 11/2004 | Masuda et al. | 438/710 |
| 7,189,940 | B2 * | 3/2007 | Kumar et al. | 219/121.43 |
| 7,264,850 | B1 * | 9/2007 | Itoh et al. | 216/71 |
| 7,993,489 | B2 * | 8/2011 | Matsumoto et al. | 156/345.47 |
| 8,012,304 | B2 * | 9/2011 | Brillhart et al. | 156/345.27 |
| 2006/0237398 | A1 * | 10/2006 | Dougherty et al. | 219/121.43 |

FOREIGN PATENT DOCUMENTS

| | | |
|---|---|---|
| JP | 2009-032774 | 2/2009 |
| JP | 2009-231341 | 10/2009 |
| JP | 2010-034481 | 2/2010 |

* cited by examiner

*Primary Examiner* — Mark Paschall
(74) *Attorney, Agent, or Firm* — Antonelli, Terry, Stout & Kraus, LLP.

(57) ABSTRACT

Provided is a heat treatment apparatus in which a heat treatment apparatus in which the thermal efficiency is high, the maintenance expense is low, the throughput is high, the surface roughness of a sample can be reduced, and the discharge uniformity is excellent, although the heat treatment is performed at 1200 ° C. or more.

A heat treatment apparatus includes: parallel planar electrodes; a radio-frequency power supply generating plasma by applying radio-frequency power between the parallel planar electrodes; a temperature measuring section measuring the temperature of a heated sample; and a control unit controlling an output of the radio-frequency power supply, wherein at least one of the parallel planar electrodes has a space where the heated sample is installed, therein, and heats the sample in the electrode by the plasma generated between the parallel planar electrodes.

14 Claims, 7 Drawing Sheets

HEAT TREATMENT APPARATUS

CLAIM OF PRIORITY

The present application claims of priority from Japanese patent application JP 2011-104841 filed on May 10, 2011, the content of which is hereby incorporated by reference into this application.

FIELD OF THE INVENTION

The present invention relates to a heat treatment apparatus that performs activation annealing or defect repairing annealing and oxidation of the surface after doping impurity to a semiconductor substrate.

BACKGROUND OF THE INVENTION

In recent years, as substrate materials of a power semiconductor device, the introduction of new materials having a wideband gap, such as silicon carbide (SiC) has been expected. SiC, the wideband gap semiconductor has physical properties more excellent than silicon (Si), such as a high insulation breakdown field, a high saturated electron velocity, and a high thermal conductivity. The high insulation breakdown field material enables element thinning or high-concentration doping and causes a high pressure-resistant or low-resistant element to be manufactured. Further, since a bandgap is large, thermal excitation electrons can be suppressed and further, since heat radiation performance is high by the high thermal conductivity, a stable operation can be implemented at a high temperature. Therefore, when the SiC power semiconductor device is actualized, significant efficiency improvement and high-performance can be expected in various power supply and electrical apparatuses such as power transport and conversion devices, industrial power devices, and home appliances.

A process of manufacturing various power devices by using SiC for a substrate is substantially the same as the process using Si on the substrate. However, a heat treatment process is the significant difference to the above. A representative example of the heat treatment process is activation annealing after ion injection of impurities in order to control conductivity of the substrate. In the case of a Si device, activation annealing is performed at a temperature of 800 to 1200° C. Meanwhile, in the case of SiC, a temperature of 1200 to 2000° C. is required due to a material property thereof.

As an annealing apparatus suitable for SiC, for example, a resistance heating furnace disclosed in Japanese Patent Application Laid-Open Publication No. 2009-32774 is known. Further, besides the resistance heating furnace type, for example, an induction heating type annealing device disclosed in Japanese Patent Application Laid-Open Publication No. 2010-34481 is known. In addition, as a method for suppressing SiC surface roughness by annealing, a method of installing a cap for exposing SiC in a part facing a SiC substrate is disclosed in Japanese Patent Application Laid-Open Publication No. 2009-231341.

SUMMARY OF THE INVENTION

When heating at 1200° C. or higher is performed in the resistance heating furnace disclosed in Japanese Patent Application Laid Open Publication No. 2009-32774, problems to be described below are remarkable.

The first problem is thermal efficiency. As heat dissipation from a furnace body, radiation is general. Therefore, since the amount of radiation increases in proportion to the fourth root of a temperature, when a heated region is large, energy efficiency required for heating deteriorates extremely. The resistance heating furnace can generally use a double tube structure in order to avoid contamination from a heater, such that the heated region becomes larger. Further, since a heated sample is distant from a heat source (heater) by the double tube, a heater unit has a high temperature equal to or higher than the heated sample, thereby significantly deteriorating efficiency. In addition, for the same reason, the heat capacity of the heated region is significantly increased and rising or falling of the temperature takes time. Therefore, as a time period from carry-in to carry-out of a heated sample increases, a throughput deteriorates and further, a time period in which the heated sample stays under a high-temperature atmosphere increases, thereby increasing surface roughness of the heated sample to be described below.

The second problem is wastefulness of a furnace material. As the furnace material, a material capable of standing 1200 to 2000° C. is limited. Therefore, a high-purity material is required at a high melting point. A furnace material which can be used for SiC is graphite or SiC itself. In general, a material in which SiC is coated on the surface by a chemical vapor deposition method in a SIC sintered body or a graphite substrate can be used as the furnace material. Since the materials are generally expensive, when the furnace body is large, a large expense is required in replacement. Further, as the higher the temperature, the shorter the life-span of the furnace body, such that a replacement expense increases as compared with a general Si process.

The third problem is the generation of surface roughness due to the evaporation of the heated sample. In heating at temperature of approximately 1800° C., Si is optionally evaporated from the surface of the heated sample, SiC to generate surface roughness or loss doped impurities, such that necessary device characteristics cannot be achieved. With respect to the surface roughness or the like of the heated sample due to the high temperature, in the related art, a method in which a carbon film is in advance formed on the surface of the heated sample and used as a protection film while heating is used. However, in the method in the related art, film formation of the carbon film and the removal thereof are required in an additional process due to a heat-treatment and the number of processes increases, and as a result, an expense increases.

Meanwhile, the induction heating method disclosed in Japanese Patent Application Laid-Open Publication No. 2010-34481 is a method in which induction current by a radio frequency flows on a heated target or an installation unit installing the heated target and has higher thermal efficiency than the resistance heating furnace type in the related art. However, in the case of induction heating, when electrical resistivity of the heated target is low, induction current required for heating increases and heat loss in an induction coil cannot be disregarded, and as a result, the heating efficiency for the heated target is not particularly high.

Further, in the induction heating type, since heating uniformity is determined by induction current that flows on the heated sample or the installation unit installing the heated target, heating uniformity cannot be sufficiently obtained on a planar disk used for manufacturing the device. When heating uniformity is bad, the heated sample may be damaged by thermal stress in quickly heating. Therefore, a temperature rising velocity needs to be decreased to a level without generating the stress, thereby deteriorating the throughput. In addition, similarly as the resistance furnace heating type, a process of forming/removing a cap film for preventing Si from being evaporated from the SiC surface at an ultrahigh temperature is additionally required.

In addition, as the SiC substrate installation method, a method of installing a cap coated with SiC in the part facing the SiC substrate is disclosed in Japanese Patent Application Laid-Open Publication No. 2009-231341. Although Si atoms are separated from the surface of the SiC substrate by evaporation under a high-temperature environment, since the Si atoms are evaporated from the opposite surface, the Si atoms ejected from the opposite surface are injected into the part of the surface of the SiC substrate where the Si is separated, thereby preventing surface roughness of the surface of the SIC substrate. As disclosed in Japanese Patent Application Laid-Open Publication No. 2009-231341, the cap merely serves as a supply source of the Si atoms during heating using a heating coil or a resistance heating heater.

Herein, since plasma generated by using a parallel planar electrode is used as the heating means, surface roughness can be reduced and the SiC substrate can be heated at 1200° C. or higher as well as thermal efficiency is high, a maintenance expense is low, and the throughput is improved by shortening a treatment time. However, as a result of specifically examining the heating treatment using plasma, it is verified that surface roughness due to non-uniformity of discharge is generated in the vicinity of the SiC substrate.

The present invention has been made in an effort to provide a heat treatment apparatus in which the thermal efficiency is high, the maintenance expense is low, the throughput is high, the surface roughness of the treated substrate can be reduced, and the discharge uniformity is excellent, even when a heated sample is heated at the temperature of 1200° C.

According to an embodiment of the present invention, there is provided a heat treatment apparatus including: parallel planar electrodes; a radio-frequency power supply generating plasma by applying radio-frequency power between the parallel planar electrodes; a temperature measuring section measuring the temperature of a heated sample; and a control unit controlling an output of the radio-frequency power supply, wherein at least one of the parallel planar electrodes has a space where the heated sample is installed, therein, and the control unit controls the output of the radio-frequency power supply by using the temperature measured by the temperature measuring section to control a heat-treatment temperature of the heated sample.

According to another embodiment of the present invention, there is provided a heat treatment apparatus including: parallel planar electrodes; and a radio-frequency power supply generating plasma by applying radio-frequency power between the parallel planar electrodes, wherein the parallel planar electrodes include a high-melting-point and low-emissivity board or coating on nonplasma contact surfaces, and at lest one of the parallel planar electrodes includes a space where the heated sample is installed, therein.

According to yet another embodiment of the present invention, there is provided a heat treatment apparatus including: parallel planar electrodes; and a radio-frequency power supply generating plasma by applying radio-frequency power between the parallel planar electrodes, wherein the parallel planar electrodes are surrounded by a reflecting mirror formed with a paraboloid revolution, and at least one of the parallel planar electrodes includes a space where the heated sample is installed, therein.

According to the embodiments of the present invention, it is possible to provide a heat treatment apparatus in which thermal efficiency is high, a maintenance expense is low, a throughput is high, surface roughness of a treated substrate can be reduced, and uniformity of discharge is excellent, even when a heated sample is heated at the temperature of 1200° C., by plasma-heating a heated sample installed in at least one inner part of a parallel planar electrode.

DETAILED DESCRIPTION OF THE PREFERRED EMBODIMENTS

Figure 1:
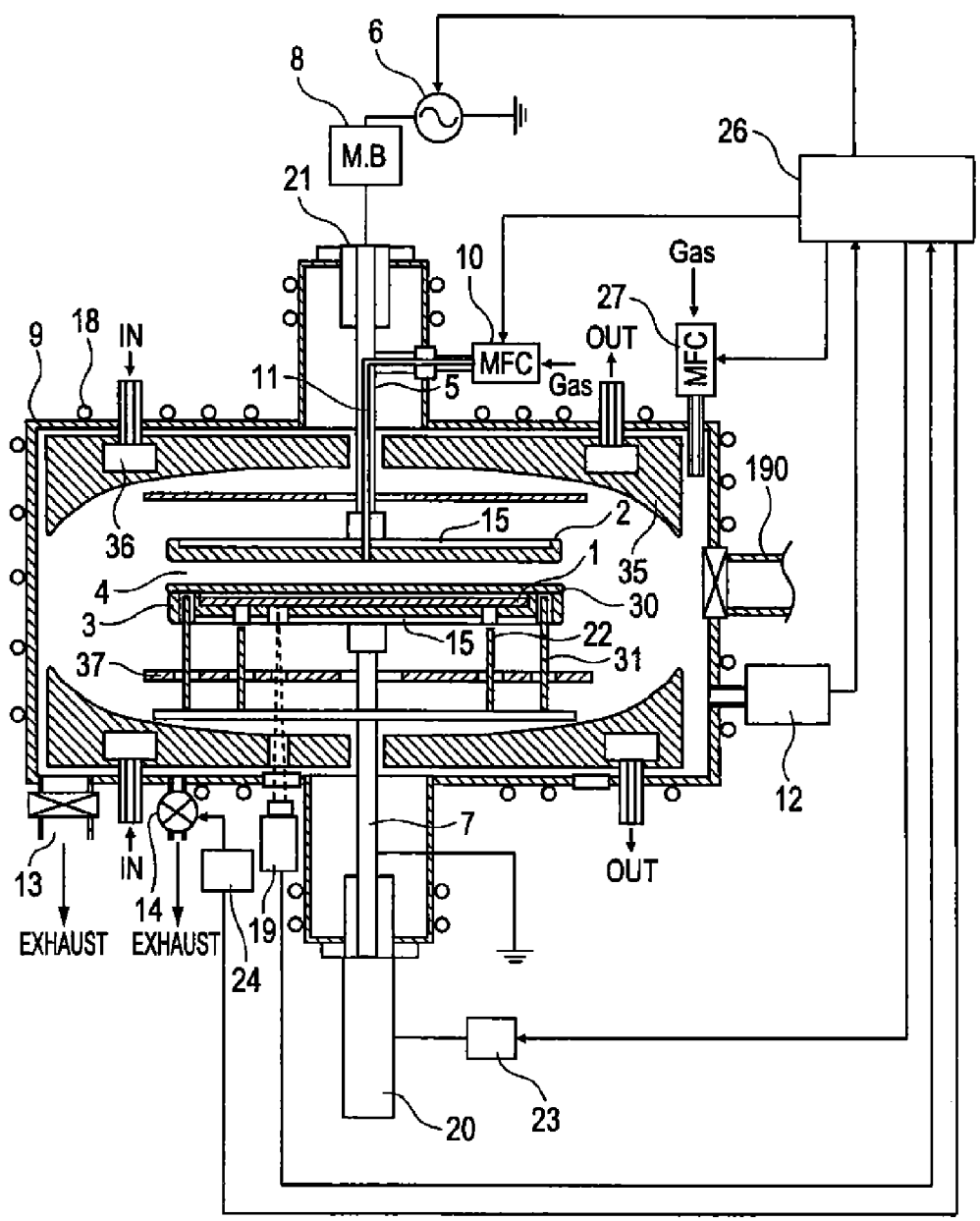
FIG. 1 is a basic configuration diagram of a heat treatment apparatus according to a first embodiment of the present invention.

Inventors of the present invention examines a cause in which a surrounding part of a heated sample becomes rough by a heat-treatment using plasma, and as a result of the examination, it is verified that it is difficult to completely make uniform the intensity of an electric field throughout the entire surface including the surrounding part of the heated sample due to a difference in a material (a difference in permittivity) between the heated sample and a lower electrode, even though a concave portion where the heated sample is positioned is installed in the lower electrode mounted with the heated sample and the surface of the heated sample has the same height as the surface of the lower electrode because of the high intensity of the electric field in each surrounding part of the heated sample. The present invention is based on the finding and is configured so that the heated sample does not affect a discharge electric field. That is, the heated sample is configured to be covered with a discharge electrode. By this configuration, the intensity of the electric field is uniform and uniformity of discharge is improved.

Hereinafter, the embodiments of the present invention will be described in more detail.

[First Embodiment]

A basic configuration of a heat treatment apparatus according to an embodiment of the present invention will be described with reference to FIG. 1. A heated sample 1 is installed on a first lower electrode 3 and a second lower electrode 30 is installed on the heated sample 1. Further, since the second lower electrode 30 contacts the first lower electrode 3 on the outer periphery thereof, the second lower electrode 30 does not contact the heated sample 1. In the embodiment, as the heated sample 1, a 4-inch (9100 mm) SiC is used. As an upper electrode 2 and the first lower electrode 3 have a diameter of 120 mm and a thickness of 5 mm. Meanwhile, the second lower electrode 30 has a diameter of 120 mm and a thickness of 1 mm. The thickness of the second lower electrode 30 may be determined considering rigidity and a heat capacity. The upper electrode 2, and the first lower electrode 3, and the second lower electrode 30 are used to deposit SiC onto the surface of a graphite substrate through a chemical vapor deposition method. A gap 4 between the second lower electrode 30 and the upper electrode 2 is 0.8 mm. Further, the heated sample 1 has a thickness of approximately 0.5 to 0.8 mm and a dent having a depth more than the thickness of the heated sample 1 installed in the first lower electrode 3 mounted with the heated sample 1. In addition, circumferential angle portions facing the upper electrode 2 and the second lower electrode 30, respectively are processed in a tapered or round shape. This is to suppress plasma localization by electric field concentration at electrode angle portions.

A radio-frequency power is supplied from a radio-frequency power supply 6 to the upper electrode 2 through a feed line 5. In the embodiment, 13.56 MHz is used as a frequency of the radio-frequency power supply 6. The second lower electrode 30 is connected with the first lower electrode 3 on the outer periphery thereof and further, the first lower electrode 3 is connected to an earth through a feed line 7. The feed lines 5 and 7 are made of graphite which is a configuration material of the upper electrode 2 and the first lower electrode 3.

A matching circuit 8 (in addition, M.B in the figure is an abbreviation of a matching box) is placed between the radio-frequency power supply 6 and the upper electrode 2 and thus, the radio-frequency power from the radio-frequency power supply 6 is supplied to plasma formed between the upper electrode 2 and the second lower electrode 30 efficiently. Gas may flow into a container 9 where the upper electrode 2, and the first lower electrode 3 and the second lower electrode 30 are placed, in the range of 0.1 to 10 atmospheric pressure by a gas introduction section 10. Gas flows into the gap between parallel planar electrodes through a gas passage 11 in the feeding line 5. The pressure of the flowing gas is monitored by a pressure detecting section 12. Further, gas is exhausted from the container 9 by a vacuum pump connected to an exhaust vent 13 and a pressure control valve 14.

Each of the upper electrode 2, the first lower electrode 3, and the second lower electrode 30 in the container 9 is surrounded by a reflecting mirror 35 formed with a paraboloid of revolution. The reflecting mirror 35 formed with the paraboloid of revolution is configured by optical grinding a paraboloid of a metallic substrate and plating or depositing gold on the grinded surface. A refrigerant path 36 is formed in the metallic substrate of the reflecting mirror 35, such that cooling water flows to maintain the temperature constantly. Since heat radiated from the upper electrode 2, the first lower electrode 3, and the second lower electrode 30 is reflected through the reflecting mirror 35, thermal efficiency can be improved. Further, when a treatment temperature is low, the reflecting mirror 35 does not particularly need to be equipped.

Further, a protective quartz plate 37 is placed between the upper electrode 2, the first lower electrode 3, and between the second lower electrode 30 and the reflecting mirror 35. The protective quartz plate 37 serves to prevent contamination of a surface of the reflecting mirror 35 by ejections (sublimation of graphite) from the upper electrode 2, the first lower electrode 3, and the second lower electrode 30 which are at an ultrahigh temperature and to prevent contamination introduced into the heated sample 1 from the reflecting mirror 35.

A high-melting point and low-emissivity board or coating 15 is placed at non-plasma contact portions of the upper electrode 2 and the first lower electrode 3. Since the radiation heat from the upper electrode 2 and the first lower electrode 3 is reduced by the high-melting point and low-emissivity board or coating 15, thermal efficiency can be improved. Further, when the treatment temperature is low, the high-melting point and low-emissivity board or coating 15 does not particularly need to be equipped. In the case of an ultrahigh-temperature treatment, by providing any one of the high-melting point and low-emissivity board or coating 15 and the reflecting mirror 35 or both of them, the heating can be performed at a predetermined temperature. A cooling section 18 is installed in the container 9. The temperature of the heated sample 1 is measured by a radiation thermometer 19. In the embodiment, as the high-melting point and low-emissivity board or coating 15 placed at the non-plasma contact portions of the upper electrode 2 and the first lower electrode 3, a board coating the graphite substrate with tantalum carbide (TaC) is used. Further, reference numeral 22 represents a heated sample moving-up and down mechanism, reference numeral 23 represents a driving power supply and a control mechanism of the moving-up and down mechanism 20, reference numeral 24 represents a driving power supply and a control mechanism of the pressure control valve, and reference numeral 31 represents a second lower electrode moving-up and down mechanism. Like reference numerals refer to like elements.

Figure 7:
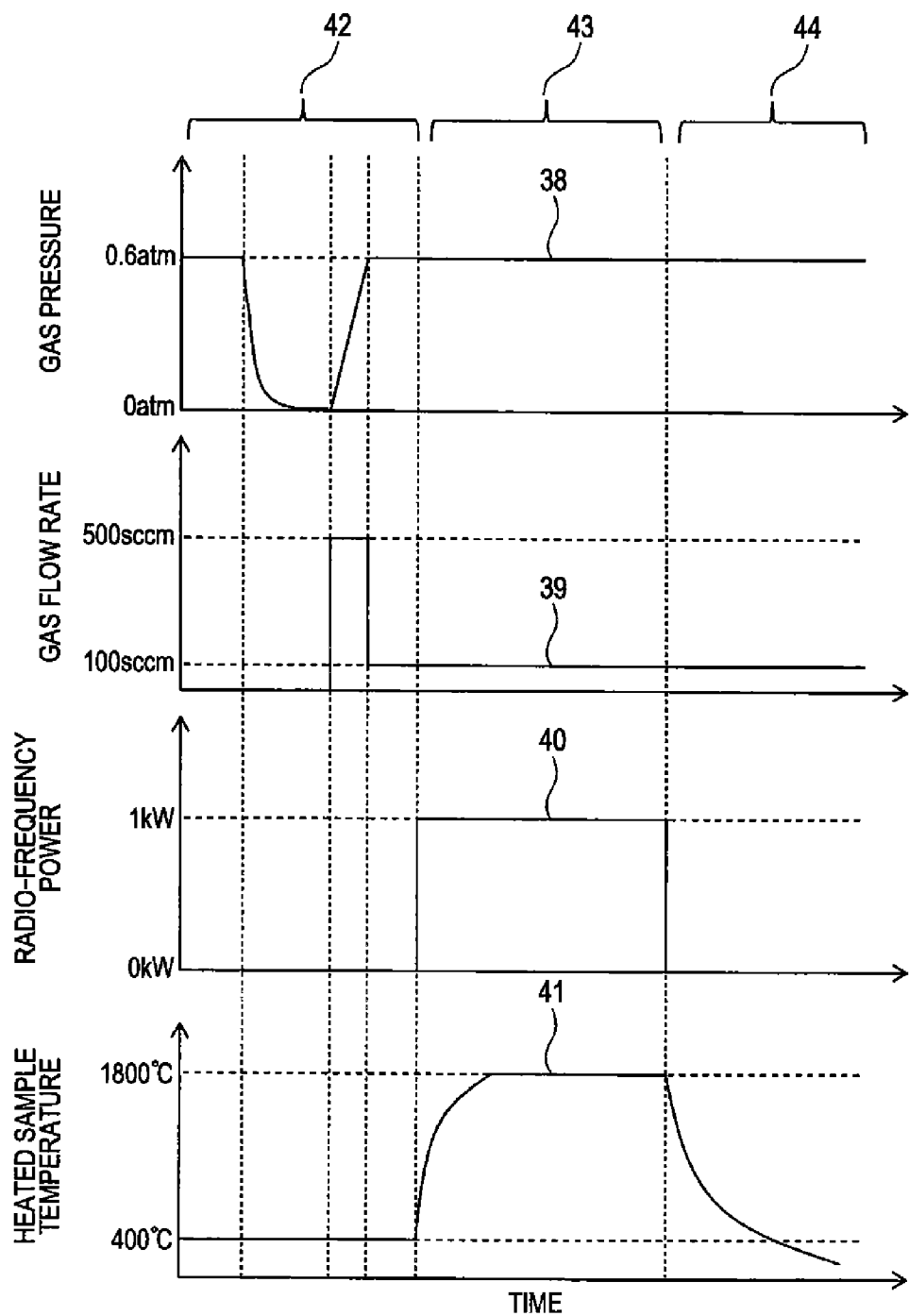
FIG. 7 is an operational explanatory diagram of the heat treatment apparatus according to the first embodiment of the present invention.

Next, in the basic configuration of FIG. 1, an example of a basic operation will be described. Further, an activated heat treatment process and temperature variation of the heated sample 1 in the process are mimetically shown in FIG. 7. In FIG. 7, reference numeral 42 represents an installation and heating preparation process of the heated sample, reference numeral 43 represents a heating process, reference numeral 44 represents a cooling process, reference numeral 38 represents a mimetic change of a gas pressure, reference numeral 39 represents a mimetic change of an He gas flow rate, reference numeral 40 represents a mimetic change of the radio-frequency power, and reference numeral 41 represents a mimetic change of the temperature of the heated sample.

First, gas in the container 9 is exhausted from the exhaust vent 13 and the container 9 is in a high-vacuum state. When the exhaust operation is sufficiently completed, the exhaust vent 13 is closed, gas is introduced from the first gas introduction section 10, and the pressure of the container 9 is set to approximately 0.6 atmospheric pressure. In the embodiment, as the introduction gas, He is used. The heated sample 1 preheated at 400° C. in a spare chamber (not shown) is transported from a transport hole 190 and placed on the first lower electrode 3. A detailed description of the placement of the heated sample 1 on the first lower electrode 3 will be described additionally in FIGS. 2, 3, and 4.

After the heated sample 1 is placed on the first lower electrode 3, the second lower electrode 30 is installed above the heated sample 1, and the first lower electrode 3 and the second lower electrode 30 are placed at predetermined positions (in the embodiment, the gap 4 is set to 0.8 mm) by the moving-up and down mechanism 20.

The first lower electrode 3 and the second lower electrode 30 are placed at the predetermined positions and thereafter, the radio-frequency power is supplied to the upper electrode 2 from the radio-frequency power supply 6 through the matching circuit 8 and a power introduction terminal 21, and plasma is generated in the gap 4 to heat the heated sample 1. Energy from the radio-frequency power is absorbed in the electrons of plasma and further, atoms or molecules of fuel gas are heated by collision of the electrons. In addition, ions generated by ionization are accelerated by a potential difference generated in a sheath of the front surface of the electrode and injected into the electrode while colliding with the fuel gas. The collision may increase a gas temperature or an electrode surface temperature of the front surface of the electrode.

In particular, at approximately an atmospheric pressure as describe above, since the ions frequently collide with the fuel gas when passing through the sheath, the fuel gas on the front surface the electrode may be efficiently heated. As a result, the temperature of the fuel gas may be easily heated to approximately 1200 to 2000°C. The upper electrode 2 and the second lower electrode 30 are heated by contacting the heated high-temperature gas. Further, some of neutral gas excited by the electron collision is deexcited with emission of light and the electrode is heated even by the light emission. In addition, the first lower electrode 3 and the heated sample 1 are heated by introduction of high-temperature gas or heat conduction or radiation from the heated upper electrode 2 and second lower electrode 30.

Herein, by placing the second lower electrode 30 above the first lower electrode 3 and the heated sample 1, the second lower electrode 30 is heated by high-temperature gas and thereafter, the heated sample 1 is heated, such that the heated sample 1 can be heated uniformly. Further, by installing the second lower electrode 30, an electric field having high uniformity is formed between the second lower electrode 30 and the upper electrode 2 and uniform discharge can be generated, regardless of an installation form of the heated sample 1. In addition, the heated sample 1 is surrounded by the first lower electrode 3 and the second lower electrode 30, such that the heated sample 1 is not directly exposed in discharge plasma formed in the gap 4, or even when glow discharge is transited to arc discharge, discharge current flows into the first lower electrode 3 and the second lower electrode 30 without passing through the heated sample 1, such that the damage to the heated sample can be prevented.

In the heating, a small amount of He gas is supplied from the gas introduction section 10 and further, the pressure of the container 9 is controlled to be maintained constantly by the pressure control valve 14. The amount of He gas introduced in the heating treatment is approximately 100 sccm in the embodiment. Accordingly, gas purity in the gap 4 is maintained during the heating treatment and when the gas purity is sufficiently maintained during heating, the gas flow may be reduced. Of course, when the gas purity is normal, the He gas may not be introduced. As the gas flow that flows during heating is large, thermal loss by gas increases, such that a minimum needed gas flow is preferably used.

The temperature of the heated sample 1 during heating is measured by the radiation thermometer 19 and an output of the radio-frequency power supply 6 is controlled so that the temperature of the heated sample 1 becomes a predetermined temperature by a control unit 26 by using the measured temperature, such that the temperature of the heated sample 1 can be high-precisely controlled. In the embodiment, the inputted radio-frequency power is maximally 10 KW. The upper electrode 2 and the first lower electrode 3 are heated at substantially the same temperature as the heated sample 1.

In order to efficiently increase the temperatures of the upper electrode 2 and the second lower electrode 30 (including the first lower electrode 3 and the heated sample 1), heat transfer from the feed lines 5 and 7, heat transfer through the He gas atmosphere, and irradiation from a high temperature range (visible light range from infrared light range) need to be suppressed. In particular, in the ultrahigh-temperature state of 1200° C. or higher, heat dissipation by radiation is very large and radiation loss is reduced to improve heating efficiency (in the case of the radiation loss, a radiation amount increases in proportion to the fourth root of an absolute temperature).

In order to suppress the radiation loss, in the embodiment, the high-melting point and low-emissivity board or coating 15 is placed in the upper electrode 2 and the first lower electrode 3 as described above. As a material of the high-melting point and low emissivity, TaC is used. TaC has emissivity in the range of about 0.05 to 0.1 and reflects infrared rays at reflectivity of approximately 90% with the radiation. As a result, the radiation loss is suppressed from the upper electrode 2 and the first lower electrode 3, such that the heated sample 1 may be heated at the ultrahigh temperature in the range of 1200 to 2000° C. with high thermal efficiency.

TaC is placed without directly contacting plasma, such that impurities included in Ta or TaC are not mixed during heat-treating the heated sample 1. Further, the heat capacity of the high-temperature melting point and low-emissivity board or coating 15 made of TaC is extremely small, and as a result, the heat capacity of the heating unit may be minimally increased. Therefore, due to the placement of the high-temperature melting point and low-emissivity board or coating 15, rates of temperature increase and temperature decrease do not nearly deteriorated.

Uniformly broadened plasma can be formed between the upper electrode 2 and the second lower electrode 30 by plasma of a glow discharge range and the planar heated sample 1 can be uniformly heated by heating the heated sample 1 with the planar plasma as a heat source. Further, by heating the heated sample 1 planarly uniform, a risk that damage is generated by temperature non-uniformity in the heated sample 1 is low in spite of raising the temperature quickly. Therefore, the temperature can rise and falls quickly and a time required to a series of heat treatments can be shortened. By this effect, a throughput of the heat treatment can be improved or the heated sample 1 can be prevented from staying under an excessive high-temperature atmosphere, such that the SiC surface roughness due to the high temperature can be reduced.

When the heating is terminated, the heated sample 1 is ejected from the transport hole 190 while the temperature of the heated sample 1 is lowered to some degree with intervals in cooling during a predetermined period and a next heated sample is transported to be placed on the first lower electrode 3. A series of operations are repeated for the next heated sample. When the heated sample 1 is replaced, a gas atmosphere at retreating position of the heated sample connected with the transport hole 190 is maintained to the same level as the gas atmosphere in the container 9, such that replacement of He in the container 9 with replacement of a processed sample is not needed and a gas used amount can be reduced. Of course, since the purity of He in the container 9 may be lowered by repeating the treatment to some degree, He is replaced periodically at that time. In the case of using He as the discharge gas, since He is relatively expensive gas, a running cost is suppressed by maximally reducing the used amount thereof. This may also be applied to the amount of He gas introduced during the heating treatment. A needed minimum flow required to maintain gas purity during the treatment is used as the He gas amount to reduce the gas used amount. Further, the cooling time of the heated sample 1 may be shortened by introducing He. That is, by increasing the He gas flow after the heating treatment is terminated (discharge is terminated), the cooling time can be shortened by the gas cooling effect.

In the basic operation of the heat treatment apparatus shown in FIG. 1, the gap 4 is 0.8 mm, but the same effect is achieved even in the range of 0.1 to 2 mm. Discharge is possible even in a gap which is narrower than 0.1 mm, but a high-precision function is required to maintain parallelism between the upper electrode 2 and the lower electrode 3 and further, transformation (roughness) of the electrode surface affects plasma, such that it is not preferable. Meanwhile, when the gap 4 is more than 2 mm, ignition of plasma deteriorates or a radiation loss between the gaps increases, such that it is not preferable.

In the basic operation of the heat treatment apparatus shown in FIG. 1, the first lower electrode 3 and the second lower electrode 30 are placed at predetermined positions and thereafter, the radio-frequency power from the radio-frequency power supply 6 is supplied to the upper electrode 2 through the matching circuit 8 and the power introduction terminal 21, and plasma in the gap 4 is generated to heat the heated sample 1, but even though the radio-frequency power from the radio-frequency power supply is supplied to any one of the first lower electrode 3 and the second lower electrode 30 or both the first lower electrode 3 and the second lower electrode 30 through the matching circuit and the power introduction terminal and plasma is generated in the gap 4 to heat the heated sample 1, the same effect can be achieved. In addition, in the embodiment, the radio-frequency power is applied to only any one of the upper electrode and the lower electrode, but the radio-frequency power may be applied to both the upper electrode and the lower electrode.

In the basic operation of the heat treatment apparatus shown in FIG. 1, a plasma forming pressure is 0.6 atmospheric pressure but the same operation is possible even in the range of 0.1 to 10 atmospheric pressure. Further, when the plasma forming pressure is higher than 10 atmospheric pressure, uniform glow discharge is difficult to occur. When the heat treatment apparatus operates at a pressure lower than 0.1 atmospheric pressure, a heat loss by heat transfer of a gas atmosphere from the upper electrode 2 and the lower electrode 3 can be reduced and the transition from the glow discharge to the arc discharge, which is accompanied by the temperature increase can be prevented. However, at a pressure lower than 0.1 atmospheric pressure, ions in plasma are injected into the heated sample 1 with relatively high energy, such that the damage may occur.

In general, motion energy damaging a crystal plane is 10 electronic bolt or higher and acceleration of ions which is higher than the value occurs to damage the crystal plane. Therefore, energy of the ions injected into the heated sample 1 should be set to 10 electronic bolt or lower. Ions in plasma are accelerated to be injected at voltage in an ion sheath formed on the surface of the heated sample 1. The voltage in the ion sheath is generated by a difference in energy between ions and electrons in plasma bulk. There, under an atmospheric pressure in which ions, electrons, and neutral particles are in a thermal equilibrium state, voltage of the ion sheath is generated little or a collision with neutral atoms in the ion sheath occurs at approximately 100 to 1000 times, such that the damage to the surface of the heated sample 1 does not almost occur. However, when the pressure falls, a difference in motion energy between the ions and the electrons occurs, such that the voltage to accelerate the ions is generated in the ion sheath. For example, a case in which a potential difference of approximately several tens to 100 V occurs in the ion sheath is presented. The thickness of the ion sheath is generally in the range of several tens μm to several hundreds μm. Meanwhile, an average free process of He ions is, for example, 20 μm or less under a He atmosphere of 1800° C. and 0.1 atmospheric pressure or less. Therefore, a rate to accelerate ions up to the potential difference is increased so that the number of collision times in the ion sheath does not reach approximately 1 to 10 times and a possibility that ions having energy higher than 10 electronic volt will be injected is increased.

In the basic operation of the heat treatment apparatus shown in FIG. 1, He is used as fuel gas for generating plasma, but although gas using rare gas such as Ar, Xe, Kr, or the like as a main raw material is used, the same effect can be achieved. He used in the operation description is excellent in plasma ignition or stability around the atmospheric pressure, but a heat loss by heat transfer under a gas atmosphere to increase thermal conductivity of gas is relatively large. Meanwhile, since gas having a large mass, such as Ar, and the like is low in thermal conductivity, the gas is advantageous in terms of thermal efficiency.

In the embodiment of FIG. 1, a board coating the graphite substrate with tantalum carbide (TaC) is used as the high melting point and low-emissivity board or coating 15 at non-plasma contact portions of the upper electrode 2 and the first lower electrode 3, but although tungsten carbide (WC), molybdenum carbide (MoC), tantalum (Ta), molybdenum (Mo), and tungsten (W) are used, the same effect can be achieved.

In the basic operation of the heat treatment apparatus shown in FIG. 1, a container, in which only the first gas introduction section 10 introducing fuel gas between the upper electrode 2 and the lower electrode 3 is used, is disclosed, but a second gas introduction section 27 is installed in addition to the first gas introduction section and gas may be introduced from other than between the upper electrode 2 and the lower electrode 3 but from other portions. In particular, when container 9 is vacuum-exhausted from the second gas introduction section 27 and charged with gas, the second gas introduction section 27 is used when gas of a relatively large flow rate will be introduced. When a relatively minute amount of gas is effectively supplied to the heated sample 1 such as a cooled engine during or after the heat-treatment, the first gas introduction section 10 is used and when the container 9 is opened to an atmosphere or when gas is charged after the exhaust, the second gas introduction section 27 is used.

In the embodiment, graphite coated with silicon carbide by the GOV method is used as the upper electrode 2, the first lower electrode 3, and the second lower electrode 30, but in addition, although a member acquired by coating a graphite group or graphite with pyrolytic carbon, a member acquired by vitrificating the graphite surface, and SiC (sintered body, polycrystalline, or single crystalline) are used, the same effect can be achieved. Graphite that serves as materials of the upper electrode 2, the first lower electrode 3, and the second lower electrode 30 or coating performed on the surface thereof preferably has high purity in terms of preventing contamination of the heated sample 1.

Further, in the embodiment, TaC is used for the high-melting-point and low-resistivity board or coating 15, but similarly, another high-melting-point (a melting point which is resistant to a used temperature) or low-emissivity material is used to provide the following effect. For example, the same effect can be achieved even in a tantalum (Ta) group, molybdenum (Mo), tungsten (W), or tungsten carbide (WC).

Furthermore, at the ultrahigh temperature, contamination the heated sample 1 may be influenced even from the feeding lines 5 and 7. Therefore, in the embodiment, the feeding lines 5 and 7 also adopt the same graphite as the upper electrode 2 and the lower electrode 3. In addition, the heat of the upper electrode 2 and the lower electrode 3 is transferred to the feeding lines 5 and 7 to be lost. Therefore, heat transfer from the feeding lines 5 and 7 needs to be maintained to a minimum level. The cross-sectional areas of the feeding lines 5 and 7 made of graphite should be decreased and the lengths thereof should be increased as possible. However, when the cross-sectional areas of the feeding lines 5 and 7 are extremely decreased and the lengths thereof are extremely increased, radio-frequency power loss in the feeding lines 5 and 7 becomes too large, such that a high heating rate of the heated sample 1 is reduced. In the embodiment, the cross-sectional areas of the feeding lines 5 and 7 made of graphite are set to 12 mm$^2$ and the lengths thereof are set to 40 mm, from the above viewpoint. The same effect can be achieved when the cross-sectional area is in the range of 5 to 30 mm$^2$ and the length is in the range of 30 to 100 mm.

In the embodiment, although the radiation loss from the electrode can be reduced with the high-melting-point and low-emissivity board or coating 15 and the heating efficiency can be improved by restoring radiation light to the electrode by using the reflecting mirror 35, the improvement of the heating efficiency can be expected even when only the high-melting-point and low-emissivity board or coating 15 is installed. Similarly, when only the reflecting mirror 35 is installed, the heating efficiency can be improved. In addition, the protective quartz plate 37 is installed in order to prevent contamination and even when the protective quartz plate 37 is not used, the heating efficiency can be significantly achieved.

In the embodiment, as described above, the heat dissipation from the upper electrode 2 and the first lower electrode 3 to determine the heating efficiency is based on (1) radiation, (2) heat transfer of the gas atmosphere, and (3) heat transfer from the feeding lines 5 and 7. At 1200° C. or higher, a main element among them is (1) radiation described above and the high-melting-point and low-emissivity board or coating 15 placed at the nonplasma contact portions of the upper electrode 2 and the first lower electrode 3 is used to prevent the radiation. Further, the heat dissipation from the feeding lines 5 and 7 is minimally prevented by optimizing the cross-sectional areas and the lengths of the feeding lines.

The (2) heat transfer of the gas atmosphere is prevented by a heat transfer distance of gas (distances from the upper electrode 2, the first lower electrode 3, and the second lower electrode 30 which are high-temperature parts to the shield (protective quartz plate) 37 or the wall of the container 9 which is a low-temperature part). Under the He atmosphere around the atmospheric pressure, heat dissipation by the heat transfer of gas is relatively high (because the thermal conductivity of He is high). Therefore, in the embodiment, each of the distances from the upper electrode 2 and the first lower electrode 3 to the shield (protective quartz plate) 37 or the wall of the container 9 is secured as 30 mm or more. A long distance is advantageous in preventing the heat dissipation, but the size of the container 9 to the heating area is increased, such that it is not preferable. By securing the distance of 30 mm or more, it is possible to prevent the heat dissipation by the heat transfer of the gas atmosphere while suppressing the size of the container 9. Of course, by using Ar having low thermal conductivity, it is possible to further prevent the heat transfer of the gas atmosphere.

In the first embodiment, although 13.56 MHz is used to generate discharge, since this is an industrial frequency, the power can be inputted at a low expense and since an electromagnetic wave leakage standard is low, an apparatus cost can be reduced. However, principally, the heated sample 1 can be heated in the same principle even at other frequencies. In particular, a frequency which is equal to or higher 1 MHz or lower than 100 MHz is preferable. In the case of a frequency which is lower than 1 MHz, radio-frequency voltage in supplying power required for heating increases, abnormal discharge (unstable discharge or discharge between the upper electrode and the lower electrode) is generated, and a stable operation is difficult, such that it is not preferable. Further, in the case of a frequency which is higher than 100 MHz, impedance in the gap 4 between the upper electrode 2 and the second lower electrode 30 decreases and the voltage required to generate plasma is difficult to acquire, such that it is not preferable.

Figure 2:
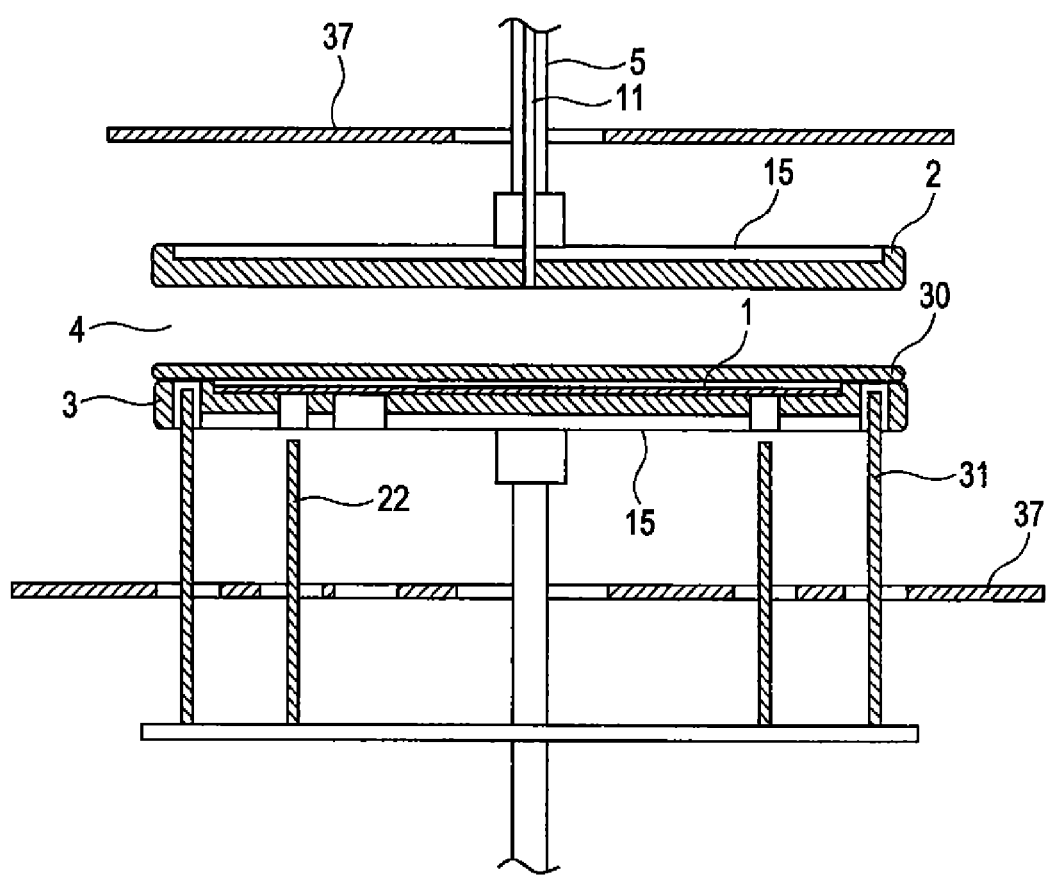
FIG. 2 is a detailed diagram of a discharge forming unit in the heat treatment apparatus according to the first embodiment of the present invention and in particular, shows the state of the discharge forming unit in a heat-treatment.
Figure 3:
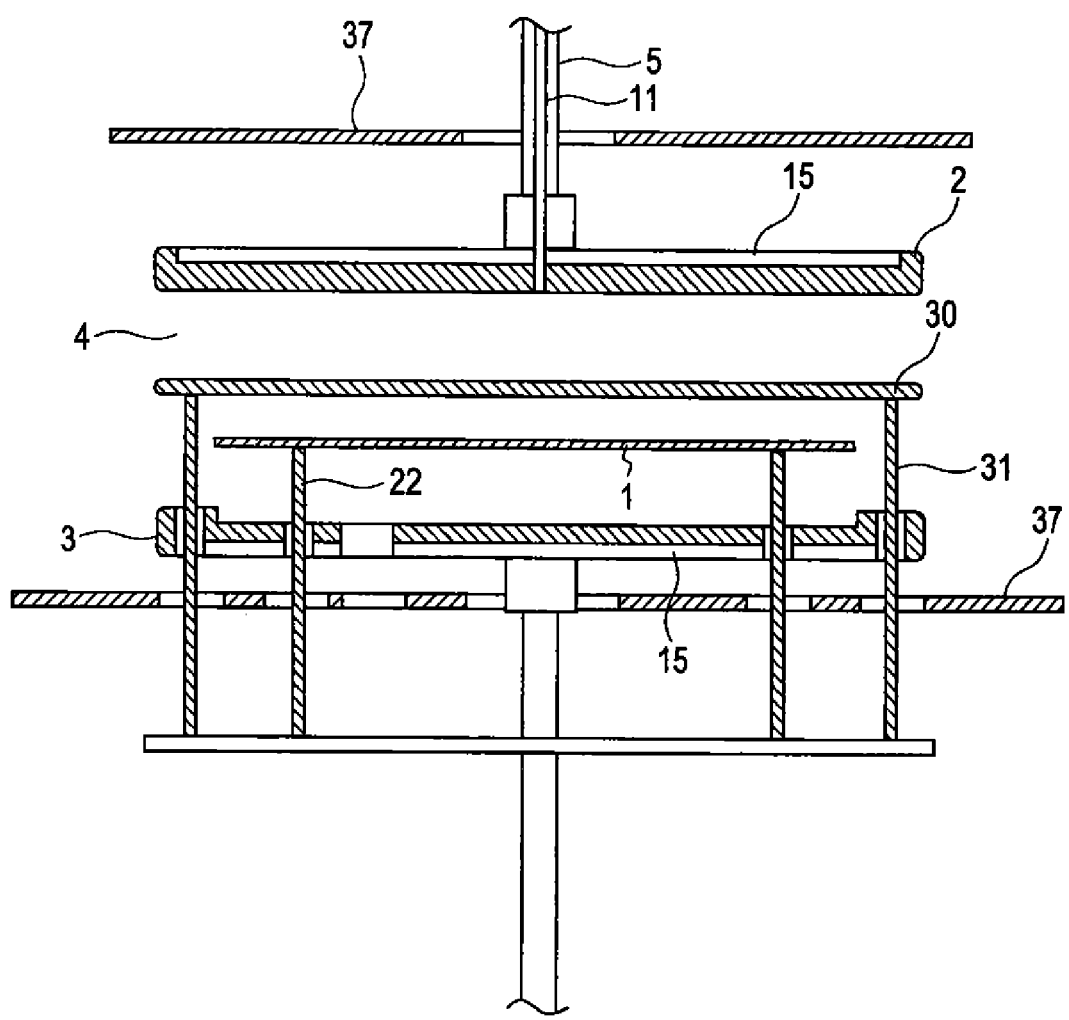
FIG. 3 is a detailed diagram of a discharge forming unit of a first example in the heat treatment apparatus according to the first embodiment of the present invention and in particular, shows the state of the discharge forming unit in transporting a heated sample.
Figure 4:
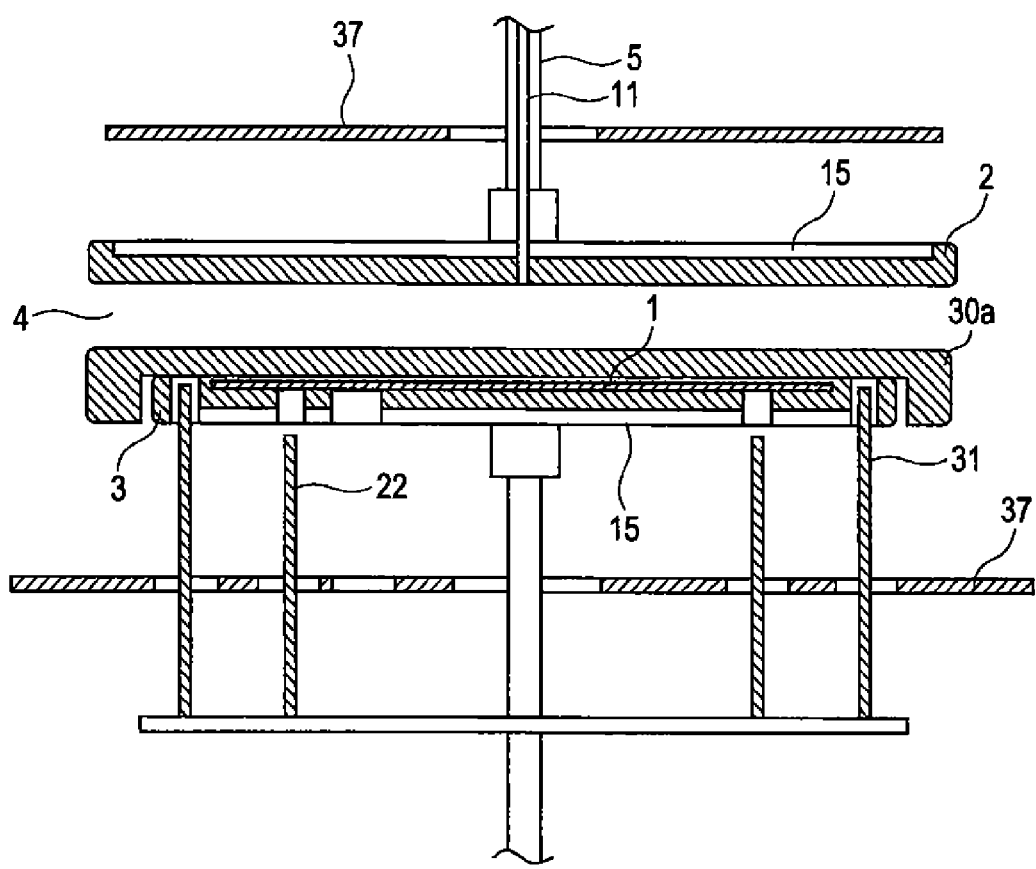
FIG. 4 is a detailed diagram of a discharge forming unit of a second example in the heat treatment apparatus according to the first embodiment of the present invention and in particular, shows the state of the discharge forming unit in transporting the heated sample.

FIGS. 2 and 3 are detailed diagrams of the heating area (the heated sample 1, the upper electrode 2, the first lower electrode 3, the second lower electrode 30, the high-melting-point and low-emissivity board or coating 15, and the shield (protective quartz plate) 37) of the heat treatment apparatus of FIG. 1. FIG. 2 shows the state during heating or cooling after heating and FIG. 3 shows the state when the heated sample 1 is transported.

When the processed sample 1 mounted above the first lower electrode 3 is carried out, the first lower electrode 3 first moves down by the moving-up and down mechanism 20 to be changed from the treatment state of FIG. 2 to the state of FIG. 3. The first lower electrode 3 moves down to form gaps among the first lower electrode 3, the second lower electrode 30, and the heated sample 1. A transport arm (not shown) is inserted into the gaps and thereafter, the heated sample moving-up and down mechanism 22 moves down, such that the heated sample 1 is transported to the transport arm to be carried out.

When the heated sample 1 is mounted on the first lower electrode 3, a process reversal thereto is performed. While the first lower electrode 3, the second lower electrode 30, and the heated sample moving-up and down mechanism 22 move down, the transport arm mounted with the heated sample 1 is inserted above the first lower electrode 3. Thereafter, the heated sample moving-up and down mechanism 22 moves up and the heated sample 1 is received from the transport arm. Further, the first lower electrode 3 is placed at the heating treatment position, the heated sample 1 is placed on the first lower electrode 3, and continually, the second lower electrode 30 may be installed on the first lower electrode 3. Since the heated sample moving-up and down mechanism 22 is exposed at a relatively high temperature, the heated sample moving-up and down mechanism 22 is preferably configured by a material which is resistant to the high temperature to prevent contamination. In the embodiment, the heated sample moving-up and down mechanism 22 is made of silicon carbide (SiC) of the sintered body. In addition, planar placement of the heated sample moving-up and down mechanism 22 may be preferable even at any position where the heated sample 1 can be held and further, the transport arm can pass through. In addition, planar placement of the second lower electrode moving-up and down mechanism 31 may be preferable even at any position where the second lower electrode 30 can be held and further, the transport arm holding the heated sample 1 can pass through.

In the embodiment, the first lower electrode 3 and the second lower electrode 30 have the same diameter as each other, but although the second lower electrode 30 has a diameter larger than the first lower electrode 3, the same effect can be achieved. Further, like the heating area shown in FIG. 4, a second lower electrode 30a covers the side surface as well as the top surface of the first lower electrode 3 where the heated sample 1 is installed to heat the heated sample more uniformly and prevent the positions of he first lower electrode 3 and the second lower electrode 30a from being deviated, or a contact point between the first lower electrode and the second lower electrode becomes distance from the gap 4 where plasma is generated, such that discharge can be stably formed.

Figure 5:
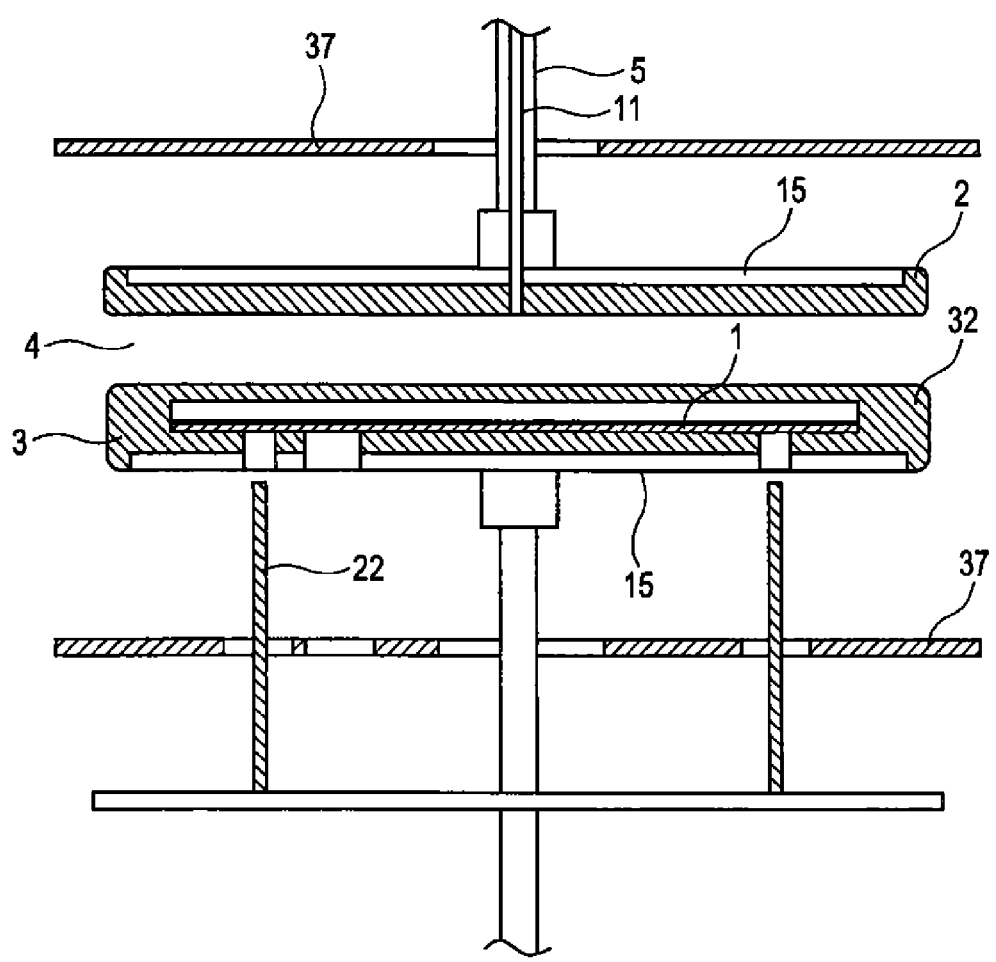
FIG. 5 is a detailed diagram of a discharge forming unit of a third example in the heat treatment apparatus according to the first embodiment of the present invention and in particular, shows the state of the discharge forming unit in transporting the heated sample.

In the embodiment, although the heated sample 1 is installed in the lower electrode between the divided electrodes into the first lower electrode 3 and the second lower electrode 30, but the lower electrode is not divided and may be integrally formed as shown in FIG. 5. In a hollow lower electrode 32, the hollow is formed throughout the inside of the electrode from a part of the side surface of the lower electrode, such that the heated sample 1 may be installed in the electrode. In the case of the heated sample 1, the heated sample moving-up and down mechanism 22 is positioned above the heated sample 1 to form a gap between the heated sample 1 and the hollow lower electrode 32, the transport arm is inserted into the gap, and the heated sample 1 can be carried in and out.

[Second Embodiment]

Figure 6:
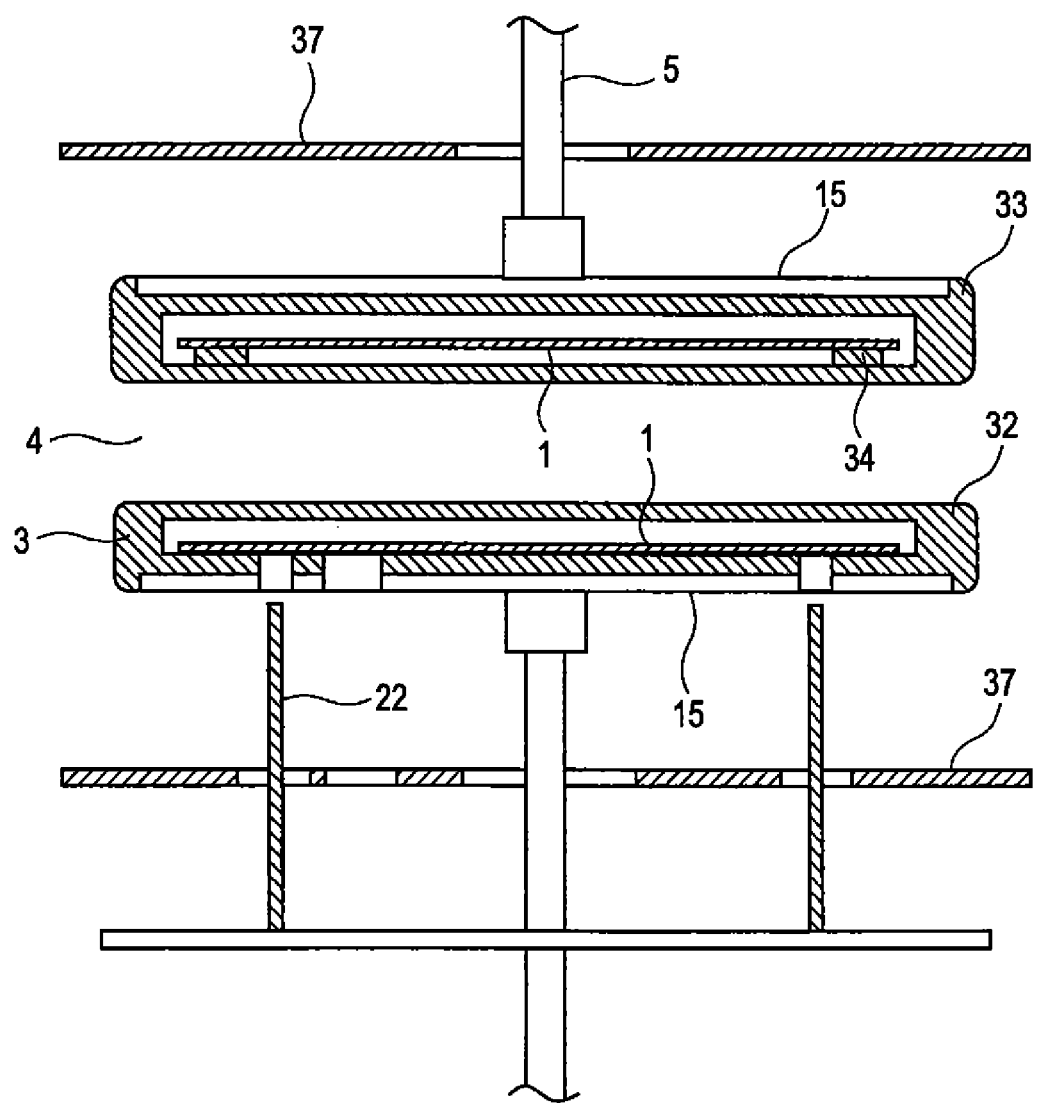
FIG. 6 is a detailed diagram of a discharge forming unit in a heat treatment apparatus according to a second embodiment of the present invention and in particular, shows the state of the discharge forming unit in a heat-treatment.

FIG. 6 shows a case in which the heated sample 1 is placed even in the upper electrode as well as the lower electrode. In order to install the heated sample 1 in the hollow upper electrode 33, the heated sample is placed on the wall of the hollow of the hollow upper electrode 33 at the side of the gap 4 where plasma is formed. In order to use the heated sample moving-up and down mechanism used in the lower electrode, a hole is formed at the gap 4 of the hollow upper electrode 33, such that the heating uniformity is deteriorated. Herein, a protrusion 34 is installed in the hollow of the hollow upper electrode 33, the heated sample 1 is placed above the protrusion 34 to form the gap between the inner wall of the hollow upper electrode 33 and the heated sample 1, and the heated sample 1 can be carried in and out by the transport arm. The heated sample 1 locally contacts the protrusion 34 of the upper electrode, but a heating mechanism is primarily performed by heated gas and the heated gas and the electrode temperature can be almost the same as each other, such that the heated sample 1 can be heated uniformly. In the embodiment, the inside of the hollow upper electrode 33 is hollowed to be integrated, but although the hollow upper electrode 33 is divided into two or more, the same effect can be achieved.

In the embodiments shown in FIGS. 1, 2, 3, 4, 5, and 6, although one heated sample 1 is placed on each of the upper electrode or the lower electrode, the upper electrode and the lower electrode are upsized and plural heated samples 1 are placed in the upper electrode and the lower electrode to be treated at the same time.

The SiC substrate into which the ions are injected is heated-treated at 1500° C. for one minute by using the heat treatment apparatus shown in FIG. 1, such that an excellent conductive property can be achieved. Further, since the surface of the SiC substrate includes a periphery surface roughness cannot be recognized.

Hereinafter, the effects of the present invention described in the embodiments are collected. In the present invention, the heated sample 1 is heated by using gas heating by atmospheric pressure glow discharge generated among the narrow gap as a heat source. According to the principle, four effects can be achieved shown in below, which is not included in the related art.

The first effect is thermal efficiency. Heat capacity of gas between the gaps is extremely small and the high-melting-point and low-emissivity board or coating 15 is placed on nonplasma contact surfaces of the upper electrode 2 and the first lower electrode 3 including the heated sample 1, such that the heated sample 1 can be heated while the heating loss caused by the radiation is extremely small.

The second effect is heating responsiveness and uniformity. Since the heat capacity of the heating unit is extremely small, the temperature may rise or fall quickly. Further, since gas heating by the glow discharge is used as the heating source, planar uniform heating can be performed by extending the glow discharge. The high temperature uniformity can suppress a device property deviation in a plane of the heated sample 1 according to the heat-treatment and suppress damage by thermal stress according to a temperature difference in the plane of the heated sample when the temperature increases quickly.

The third effect is reduction of consumable components required to the heating treatment. In the present invention, in order to directly heat gas contacting an electrode covering the heated sample 1, the high-temperature area is limited to a member which is placed extremely near the heated sample 1 and further, the temperature is also the same as the heated sample 1. Therefore, the life-span of the member increases and a replacement area due to component deterioration is also small.

The fourth effect is suppressing of the surface roughness of the heated sample 1. In the present invention, by the above-mentioned effects, a temperature rising/falling time can be shortened, such that an exposure time of the heated sample 1 under the high-temperature environment is shortened to the minimum, thereby suppressing the surface roughness. Further, in the present invention, although plasma generated by the atmospheric-pressure glow discharge is used as the heating source, the heated sample is shielded by an electrode material and is not exposed directly by plasma. As a result, a process of forming and removing a protective film performed by an apparatus other than the heat treatment apparatus is not required, such that manufacturing cost can be reduced.

What is claimed is:

1. A heat treatment apparatus, comprising:
   a heat processing chamber for heat processing a sample to be heated;
   a plate electrode disposed in the heat processing chamber;
   a first electrode disposed in the heat processing chamber so as to face the plate electrode so that plasma generates between first electrode and the plate electrode;
   a second electrode on which the sample to be heated is mounted, and is disposed in the processing chamber so as to face the plate electrode across the first electrode; and
   a radio-frequency power supply which supplies radio-frequency power to the plate electrode to generate plasma;
   wherein the plate electrode, the first electrode and the second electrode are made of a graphite base material;
   wherein the first electrode is electrically connected to the second electrode when the radio-frequency power is supplied to the plate electrode; and
   wherein the second electrode has a space where the sample to be heated is installed, and the second electrode is grounded through a feed line.

2. The heat treatment apparatus according to claim 1, wherein the feed line is made of graphite.

3. The heat treatment apparatus according to claim 1, wherein the plate electrode had a high-melting point and low-emissivity board on a surface which does not face the first electrode, and the second electrode has a high-melting point and low-emissivity board on a surface which does not face the first electrode.

4. The heat treatment apparatus according to claim 2, wherein the plate electrode has a high-melting point and low-emissivity coating on a surface which does not face the first electrode, and the second electrode has a high-melting point and low-emissivity coating on a surface which does not face the first electrode.

5. The heat treatment apparatus according to claim 3, wherein the board is a graphite substrate coated with tantalum carbide.

6. The heat treatment apparatus according to claim 3, further comprising:
a reflecting mirror which is disposed in the heat processing chamber so as to surround all of the plate electrode, the first electrode and the second electrode, and which reflects radiation heat from the plate electrode and the second electrode.

7. The heat treatment apparatus according to claim 4, further comprising:
a reflecting mirror which is disposed in the heat processing chamber so as to surround all of the plate electrode, the first electrode and the second electrode, and which reflects radiation heat from the plate electrode and the second electrode.

8. The heat treatment apparatus, comprising:
a heat processing chamber for heat processing a sample to be heated;
a first electrode which has a plate shape, and is disposed in the heat processing chamber;
a second electrode on which the sample to be heated is mounted, and disposed in the processing chamber so as to face the first electrode; and
a radio-frequency power supply which supplies radio-frequency power to the first electrode to generate plasma between the first electrode and the second electrode;
wherein the first electrode and the second electrode are made of a graphite base material; and
wherein the second electrode has a space inside where the sample to be heated is installed, and the second electrode is grounded through a feed line.

9. The heat treatment apparatus according to claim 8, wherein the feed line is made of graphite.

10. The heat treatment apparatus according to claim 8, wherein the first electrode has a high-melting point and low-emissivity board on a surface which does not face the second electrode, and the second electrode has a high-melting point and low-emissivity board on a surface which does not face the first electrode.

11. The heat treatment apparatus according to claim 9, wherein the first electrode has a high-melting point and low-emissivity coating on a surface which does not face the second electrode, and the second electrode has a high-melting point and low-emissivity coating on a surface which does not face the first electrode.

12. The heat treatment apparatus according to claim 10, further comprising:
a reflecting mirror which is disposed in the heat processing chamber so as to surround the first electrode and the second electrode, and which reflects radiation heat from the first electrode and the second electrode.

13. The heat treatment apparatus according to claim 11, further comprising:
a reflecting mirror which is disposed in the heat processing chamber so as to surround the first electrode and the second electrode, and which reflects radiation heat from the first electrode and the second electrode.

14. The heat treatment apparatus according to claim 10, wherein the board is a graphite substrate coated with tantalum carbide.

* * * * *